(12) United States Patent
Butler et al.

(10) Patent No.: US 6,385,098 B2
(45) Date of Patent: May 7, 2002

(54) METHOD AND APPARATUS FOR SUPPLYING REGULATED POWER TO MEMORY DEVICE COMPONENTS

(75) Inventors: Hal W. Butler; Stephen L. Casper; Stephen R. Porter, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/836,947

(22) Filed: Apr. 17, 2001

Related U.S. Application Data

(63) Continuation of application No. 09/388,126, filed on Sep. 1, 1999, now Pat. No. 6,219,293.

(51) Int. Cl.[7] .............................................. G11C 16/04
(52) U.S. Cl. .............. 365/189.09; 365/226; 365/189.11
(58) Field of Search ........................ 365/189.09, 189.11, 365/226; 327/535, 536, 538

(56) References Cited

U.S. PATENT DOCUMENTS

| | | | |
|---|---|---|---|
| 5,552,739 A | 9/1996 | Keeth et al. | 327/538 |
| 5,592,421 A | 1/1997 | Kaneko et al. | 365/189.09 |
| 5,596,534 A | 1/1997 | Manning | 365/189.09 |
| 5,757,170 A | * 5/1998 | Pinney | 323/266 |

* cited by examiner

Primary Examiner—Huan Hoang
(74) Attorney, Agent, or Firm—Dorsey & Whitney LLP

(57) ABSTRACT

An internal voltage regulator for a synchronous random access memory ("SDRAM") uses a regulator circuit to supply power to charge pumps that is separate from a regulator circuit that supplies power to the arrays of the SDRAM. The regulator supplies an output voltage to the charge pumps that is maintained constant as the external supply voltage is increased beyond its normal operating range. In contrast, a regulated circuit that supplies power to the arrays increases as the supply voltage is increase beyond its normal operating range. As a result, the voltage regulator allows the arrays to be stress tested with a relatively high regulated output voltage without applying an excessive and potentially damaging regulated output voltage to the charge pumps.

31 Claims, 6 Drawing Sheets

METHOD AND APPARATUS FOR SUPPLYING REGULATED POWER TO MEMORY DEVICE COMPONENTS

CROSS-REFERENCE TO RELATED APPLICATION

This application is a continuation of U.S. patent application No. 09/388,126, filed Sep. 1, 1999, U.S. Pat. No. 6,219,293.

TECHNICAL FIELD

This invention relates to memory devices, and more particularly, to a method and apparatus for supplying regulated power to various components of memory devices in a manner that facilitates stress testing of the components.

BACKGROUND OF THE INVENTION

Memory devices are in common use in a wide variety of applications. For example, memory devices are used in personal computers, telephone answering machines, and cellular telephones. Various types of memory devices are commercially available, including read-only memories ("ROMs"), which may be programmable ("PROMs"), and random access memories ("RAMs"), which may be either static random access memories ("SRAMs") or dynamic random access memories ("DRAMs"). Furthermore, there are a variety of DRAM types available, and more being developed. For example, asynchronous DRAMs, synchronous DRAMs ("SDRAMs"), and video graphics DRAMs are currently available, and Synchronous Link DRAMs ("SLDRAMs") and RAMBUS DRAMs ("RDRAMs") will soon be available.

Although the following discussion of problems encountered when testing conventional memory devices will focus on such problems in the context of an SDRAM, it will be understood that these or similar problems exist to varying degrees with other types of memory devices. Similarly, although the solutions to these problems using the disclosed embodiments of the invention are explained in the context of an SDRAM, it will be understood that they are applicable to other types of memory devices.

One example of a conventional SDRAM 10 exhibiting problems that can be alleviated using the disclosed embodiments of the invention is shown in FIG. 1. The SDRAM 10 includes an address register 12 that receives either a row address or a column address on an address bus 14. The address bus 14 is generally coupled to a memory controller (not shown in FIG. 1). A row address is initially received by the address register 12 and applied to a row address multiplexer 18. The row address multiplexer 18 couples the row address to a number of components associated with either of two memory banks 20, 22 depending upon the state of a bank address bit BA forming part of the row address. Associated with each of the memory banks 20, 22 are a respective row address latch 30 which, stores the row address, and a row decoder 32, which applies various row signals to its respective array 20 or 22 as a function of the stored row address. The row address multiplexer 18 also couples row addresses to the row address latches 30 for the purpose of refreshing the memory cells in the arrays 20, 22. The row addresses are generated for refresh purposes by a refresh counter 40, which is controlled by a refresh controller 42.

After the row address has been applied to the address register 12 and stored in one of the row address latches 30, a column address is applied to the address register 12. The address register 12 couples the column address to a column address latch 50. Depending on the operating mode of the SDRAM 10, the column address is either coupled through a burst counter 52 to a column address buffer 56 or to the burst counter 52 which applies a sequence of column addresses to the column address buffer 56 starting at the column address output by the address register 12. In either case, the column address buffer 56 applies a column address to a column decoder 58, which applies various column signals to respective column circuitry 60, 62, each of which includes sense amplifiers and associated circuitry.

The column circuitry 60, 62 receive data from the arrays 20, 22, respectively, and couple the data to a data output register 70, which applies the data to a data bus 72. Data to be written to one of the arrays 20, 22 is coupled from the data bus 72 through a data input register 74 to the column circuitry 60, 62 where it is transferred to one of the arrays 20, 22, respectively. A mask register 76 may be used to selectively alter the flow of data into and out of the column circuitry 60, 62 such as by selectively masking data to be read from the arrays 20, 22, respectively.

The above-described operation of the SDRAM 10 is controlled by a command decoder 78 responsive to high level command signals received on a control bus 79. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the "*" designating the signal as active low. However, other high level command signals may be used. In either case, the command decoder 78 generates a sequence of command signals responsive to the high level command signals to carry out the function (e.g., a read or a write) designated by each of the high level command signals.

The SDRAM 10 also includes an internal voltage regulator 80 that supplies various regulated voltages, including $V_{PP}$, $V_{CCR1}$ and $V_{CCR2}$. $V_{PP}$ is typically a "pumped" voltage having a magnitude greater than the magnitude of an external supply voltage $V_{CCX}$, and is used for such purposes as generating wordline voltages for the arrays 20, 22, and supplying power to the data output register 70. However, a negative pumped voltage $V_{BB}$ may also be generated that is used to bias the substrate of the SDRAM 10. The voltage $V_{CCR1}$ is typically a regulated voltage that is used to apply power to the arrays 20, 22, and $V_{CCR2}$ is typically a regulated voltage that is used to apply power to the other circuitry in the SDRAM 10.

The internal voltage regulator 80 is illustrated in further detail in FIG. 2. The voltage regulator 80 includes three internal voltage regulator circuits 90, 92, 94, each of which is powered by the external power supply voltage $V_{CCX}$. The voltage regulator circuits 90, 92, 94 are identical to each other, and thus have the same performance characteristics. Each of the voltage regulator circuits 90, 92, 94 is also coupled to a reference voltage generator 96, which supplies the voltage regulator circuits 90, 92, 94 with a common reference voltage $V_{REF}$. The design of the reference voltage circuit 96, which has the characteristics described below, is well within the ability of one of ordinary skill in the art. Therefore, in the interests of brevity, a specific design for the reference voltage circuit 96 will not be described.

The voltage regulator circuit 90 generates a regulated voltage $V_{CCR1}$ which, as explained above, supplies power to the arrays 20, 22. Similarly, the voltage regulator circuit 92 generates a regulated voltage $V_{CCR2}$, which supplies power to the other circuitry in the SDRAM 10. Finally, the voltage regulator circuit 94 generates a regulated voltage $V_{CCR3}$, which supplies power to conventional charge pumps 98. The charge pumps 98, which are generally entirely separate circuits (not shown) for each pumped supply voltage, generate a positive pumped supply voltage $V_{PP}$, which may be used as described above, and a negative voltage $V_{BB}$, which, as described above, is used to bias the substrate of the SDRAM 10.

The performance characteristic of the regulator circuits 90, 92, 94 is shown in FIG. 3, in which the regulated output voltage $V_{CCR}$ is shown on the y-axis as a function of the external supply voltage $V_{CCX}$ plotted on the x-axis. As shown in FIG. 3, the regulated output voltage $V_{CCR}$ increases linearly with the external supply voltage $V_{CCX}$ until the regulator circuits 90, 92, 94 begin to regulate, which occurs at about two volts. Thereafter, the regulated output voltage $V_{CCR}$ remains constant as the external supply voltage $V_{CCX}$ continues to increase. However, the regulator circuits 90, 92, 94 are only capable of regulating the output voltage $V_{CCR}$ over a limited range of supply voltages. When the external supply voltage $V_{CCX}$ reaches about 4 volts, the output voltage from the regulator circuits 90, 92, 94 starts to increase linearly with $V_{CCX}$ in order to perform stress testing. Also, even if the regulator circuits 90, 92, 94 are capable of regulating when the external supply voltage $V_{CCX}$ is above 4 volts, they may still perform as illustrated in FIG. 3 if the reference voltage $V_{REF}$ increases with the external supply voltage $V_{CCX}$ when the external supply voltage $V_{CCX}$ is above 4 volts.

The performance characteristics of the regulator circuits 90, 92, 94 do not present a problem during normal operation of the SDRAM 10 because the external supply voltage $V_{CCX}$ is normally maintained within the operating range of the regulator circuits 90, 92, 94. However, these performance characteristics do present a problem during testing of the SDRAM 10, as explained below.

Difficulties also arise in testing the SDRAM 10 at external supply voltages $V_{CCX}$ above the normal operating range of the regulator circuits 90, 92, 94. More particularly, since the pumped voltage $V_{PP}$ is normally a voltage greater than, and directly proportional to, the regulated output voltage $V_{CCR3}$ supplying power to the charge pumps 98, the voltages present in the charge pumps 98 can become very large as the regulated output voltage $V_{CCR3}$ increases. Although the other regulated output voltages $V_{CCR1}$ and $V_{CCR2}$ are normally proportional to the external supply voltage $V_{CCX}$ above the normal operating range of the regulator circuits 90, 92, 94, the voltages present in the circuitry powered by the output voltages $V_{CCR1}$ and $V_{CCR2}$ are relatively low since $V_{CCR1}$ and $V_{CCR2}$ are typically less than $V_{CCX}$. As the external supply voltage $V_{CCX}$ is increased above the normal operating range of the regulator circuits 90, 92, 94, the resulting high voltages present in the charge pumps 98, which may be 2–3 times the magnitude of the supply voltage, can damage the charge pumps 98, even though the arrays 20, 22 and other circuitry in the SDRAM 10 would continue to operate. As a result of the performance characteristics of the regulator circuits 90, 92, 94, it can be impractical to stress test the SDRAM 10 at adequately high external supply voltages $V_{CCX}$.

The regulator circuits 90, 92, 94 have been described as generating output voltages $V_{CCR1}$, $V_{CCR2}$ and $V_{CCR3}$ having the same magnitude. However, it will be understood that the problems described above would continue to exist even if the regulator circuits 90, 92, 94 were adjusted to output regulated output voltages $V_{CCR1}$, $V_{CCR2}$ and $V_{CCR3}$ having different magnitudes or some of the regulated output voltages $V_{CCR1}$, $V_{CCR2}$ and $V_{CCR3}$ were scaled to a lower voltage. For example, assume the regulator circuit 90 generates an output voltage $V_{CCR1}$ of 1.5 volts and the regulator circuit 94 generates an output voltage $V_{CCR3}$ of 3 volts when an external supply voltage $V_{CCX}$ within the normal operating range of the regulator circuits 90, 92, 94 is applied to the SDRAM 10, When the external supply voltage $V_{CCX}$ is raised 1 volt above the normal operating range, the regulator circuit 90 would generate an output voltage $V_{CCR1}$ of 2.5 volts and the regulator circuit 94 would generate an output voltage $V_{CCR3}$ of 4 volts. This regulated voltage $V_{CCR3}$ of 4 volts might very well damage the charge pumps 98 even though the arrays 20, 22 would continue to operate without damage at a regulated output voltage $V_{CCR1}$ of 2.5 volts.

There is therefore a need for an improved method and apparatus for supplying regulated voltages to the components of memory devices, including the SDRAM 10 and other varieties of DRAMs.

SUMMARY OF THE INVENTION

In accordance with one aspect of the invention, an internal voltage regulator provides power to a memory device having an array of memory cells and a charge pump. The internal voltage regulator includes at least two regulator circuits adapted to receive an external supply voltage and operable to generate respective regulated output voltages. The first regulator circuit supplies a first regulated output voltage to the array of memory cells, and the second regulator circuit supplies a second regulated output voltage to the charge pump. The first regulator circuit generates the first regulated output voltage as a first function of the external supply voltage, and the second regulator circuit generates the second regulated output voltage as a second function of the external supply voltage, the second function being different from the first function. In operation, the first regulator circuit supplies power to at least a portion of the array at a first voltage when the external supply voltage has a magnitude that is less than a predetermined voltage. When the external supply voltage has a magnitude that is greater than the predetermined voltage, the first regulator circuit supplies power to the array at a voltage having a magnitude that is greater than the magnitude of the first voltage. In contrast, the second voltage regulator supplies power to the charge pump at a second voltage when the external supply voltage has a magnitude that is less than the predetermined voltage and also when the external supply voltage has a magnitude that is greater than the predetermined voltage. As a result, the voltage of power supplied to the array can be raised by raising the external voltage without raising the voltage of power supplied to the charge pump.

DETAILED DESCRIPTION OF THE INVENTION

Figure 4:
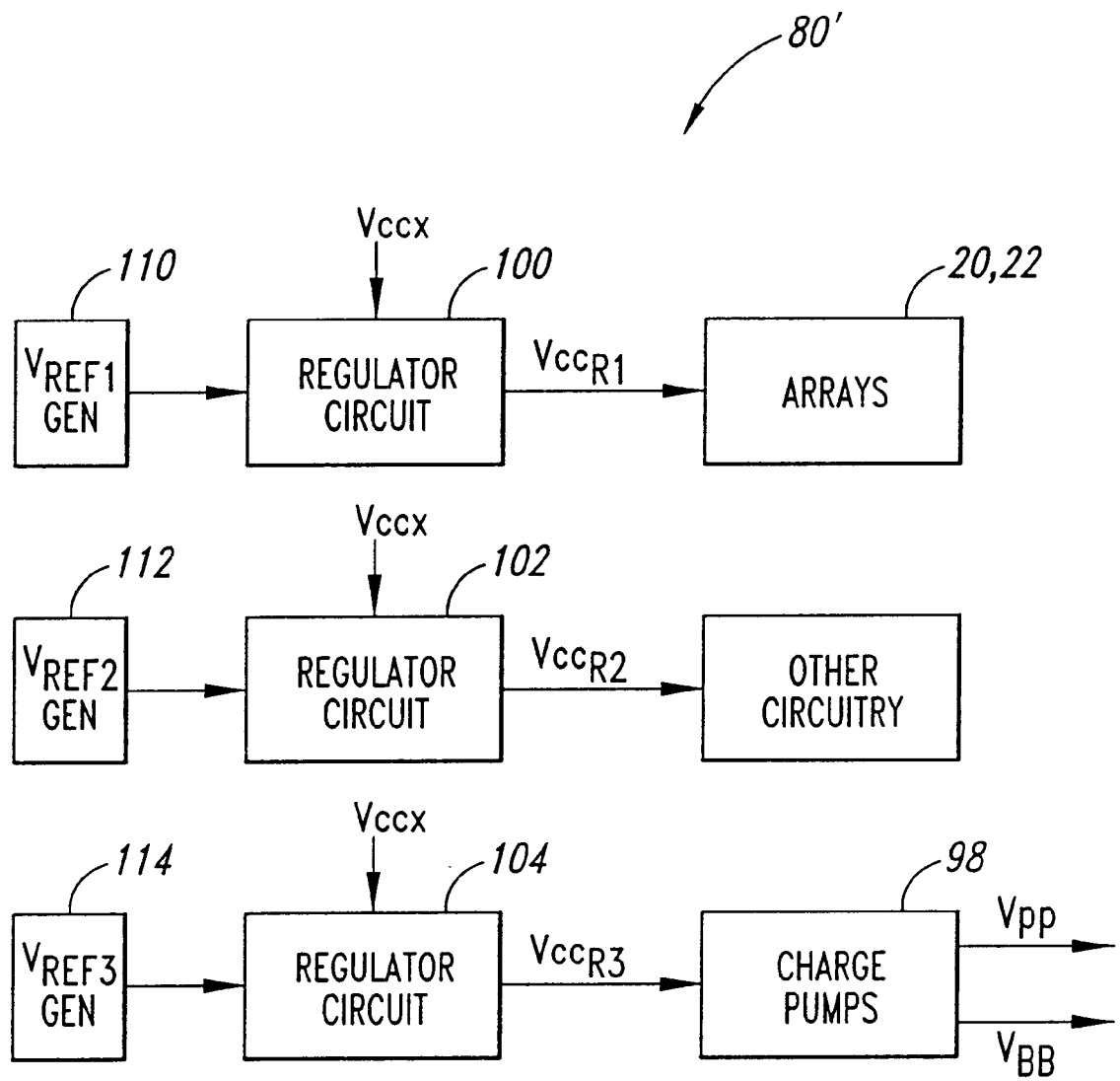
FIG. 4 is a block diagram of one embodiment of the invention for supplying regulated power to various components in the memory device of FIG. 1.

One embodiment of an internal voltage regulator 80' in accordance with the invention is illustrated in FIG. 4. The voltage regulator 80' may be used in the SDRAM 10 (FIG. 1) in place of the voltage regulator 80. As shown in FIG. 4, the voltage regulator 80', like the voltage regulator 80, includes three identical voltage regulator circuits 100, 102, 104. The voltage regulator circuit 100 generates a regulated output voltage $V_{CCR1}$ that supplies power to the arrays 20, 22. The regulator circuit 102 generates a regulated output voltage $V_{CCR2}$ that supplies power to the other circuitry in the SDRAM 10. The regulator circuit 104 generates a regulated output voltage $V_{CCR3}$ that supplies power to the charge pumps 98. The charge pumps 98 then produce a pumped output voltage $V_{PP}$ and a substrate bias voltage $V_{BB}$.

Figure 2:
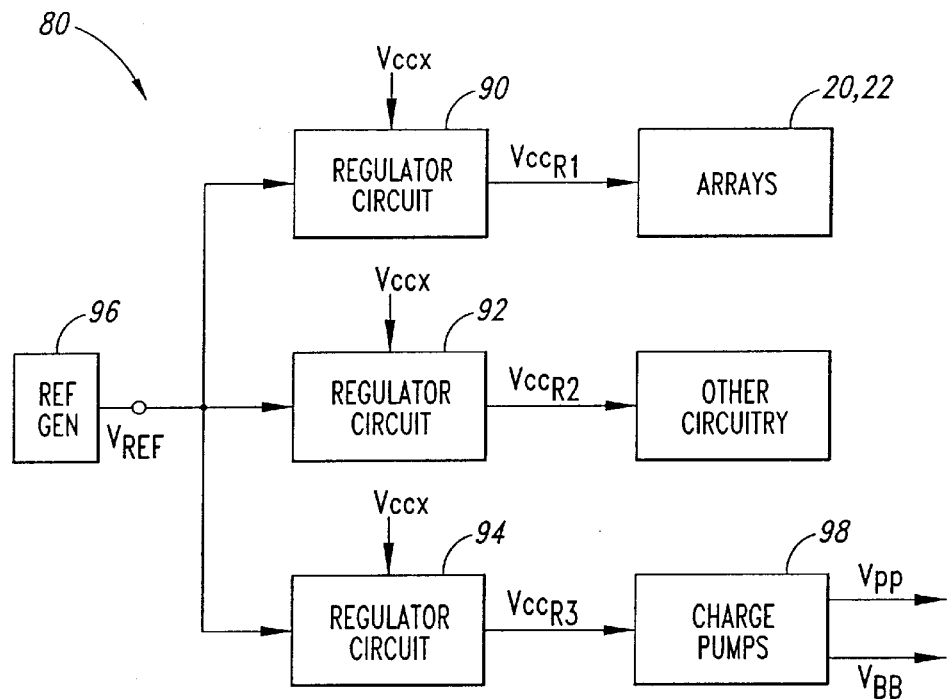
FIG. 2 is a block diagram of a conventional system for supplying regulated power to various components in the memory device of FIG. 1.

Unlike the internal voltage regulator 80 of FIG. 2, the embodiment of the internal voltage regulator 80' shown in FIG. 4 includes a respective reference voltage generator 110, 112, 114 for each of the regulator circuits 100, 102, 104. Thus, the reference voltage generator 110 applies a reference voltage $V_{REF1}$ to the voltage regulator circuit 100, the reference voltage generator 112 applies a reference voltage $V_{REF2}$ to the voltage regulator circuit 102, and the reference voltage generator 114 applies a reference voltage $V_{REF3}$ to the voltage regulator circuit 104. As explained in greater detail below, it is significant that the reference voltage $V_{REF3}$ applied to the regulator circuit 104 may be different from the reference voltage $V_{REF1}$ and $V_{REF2}$ applied to at least one of the other regulator circuits 100, 102. More particularly, since the reference voltage $V_{REF3}$ applied to the regulator circuit 104 is different, the performance characteristic of the regulator circuit 104 may be different. As mentioned above, the design of the reference voltage circuits 110, 112, 114 having the characteristics described herein is well within the ability of those skilled in the art. Therefore, in the interest of brevity, an explanation of specific reference voltage circuits will be omitted.

Figure 5A:
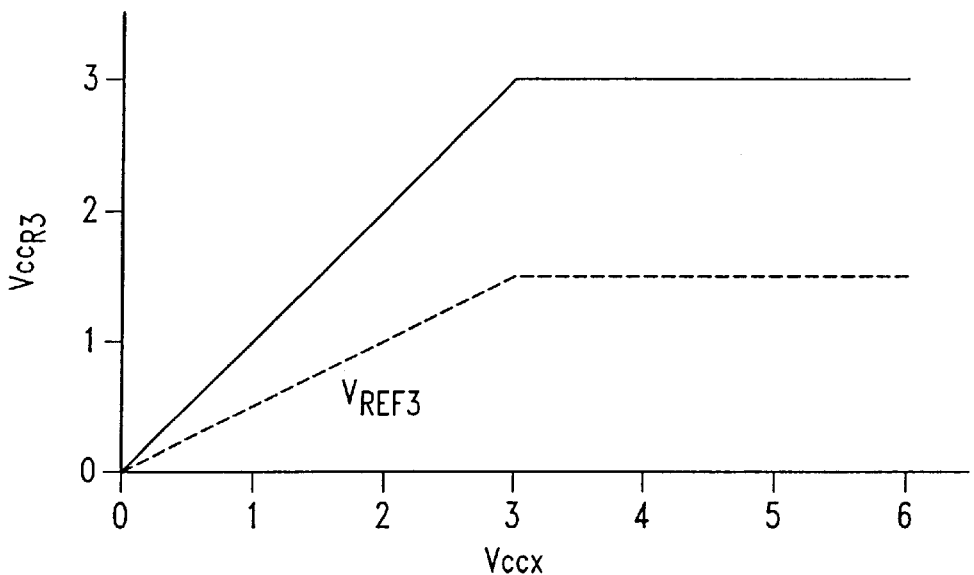
FIGS. 5A and 5B are graphs showing the voltage generated by the embodiment of the invention shown in FIG. 4 as a function of the external supply voltage.

The operation of the internal voltage regulator 80' of FIG. 4 will now be explained with reference to FIGS. 5A and 5B. As shown in FIG. 5A, the regulator circuit 104 receives a reference voltage $V_{REF3}$ that increases linearly with the external supply voltage $V_{CCX}$ until the reference voltage $V_{REF3}$ reaches 1.5 volts. The regulated output voltage $V_{CCR3}$ also increases linearly with the external supply voltage $V_{CCX}$ at twice the rate as the reference voltage $V_{REF3}$ until the regulated output voltage $V_{CCR3}$ reaches 3 volts. The reference voltage $V_{REF3}$ then remains constant at 1.5 volts as the external supply voltage $V_{CCX}$ continues to increase. The constant value of the reference voltage $V_{REF3}$ causes the regulated output voltage $V_{CCR3}$ to likewise remain constant at 3 volts. As a result, when the external supply voltage $V_{CCX}$ is raised above the normal operating range, e.g. to 5 volts, the regulated output voltage $V_{CCR3}$ remains at 3 volts, thereby preventing an excessive voltage from being applied to the charge pumps 98.

The regulator circuit 100 supplying power to the arrays 20, 22 operates in a manner that is similar to that of regulator circuit 104 as the external supply voltage $V_{CCX}$ is initially increased. However, the reference voltage $V_{REF1}$ no longer increases with the external supply voltage $V_{CCX}$ when the reference voltage $V_{REF1}$ reaches 1.25 volts. Similarly, the regulated output voltage $V_{CCR1}$ no longer increases linearly with the external supply voltage $V_{CCX}$ when the regulated output voltage $V_{REF1}$ reaches 2.5 volts. The reference voltage $V_{REF1}$ and the regulated output voltage $V_{CCR1}$ remain constant until the external supply voltage $V_{CCX}$ reaches 4 volts. Thereafter, the reference voltage $V_{REF1}$ increases linearly at half the rate of the external supply voltage $V_{CCX}$. As a result, the regulated output voltage $V_{CCR1}$ increases linearly with the external supply voltage $V_{CCX}$ when the external supply voltage $V_{CCX}$ is increased above 4 volts.

The advantages of the regulator 80' of FIG. 4 will now be explained using an example in which the external supply voltage $V_{CCX}$ is increased above the normal operating range, e.g. to a voltage of 5 volts. With an external supply voltage $V_{CCX}$ of 5 volts, the regulator circuit 104 continues to apply a regulated output voltage $V_{CCR3}$ of 3 volts to the charge pumps 98 just as is it did with the external supply voltage $V_{CCX}$ was in its normal operating range, as shown in FIG. 5A.

Figure 3:
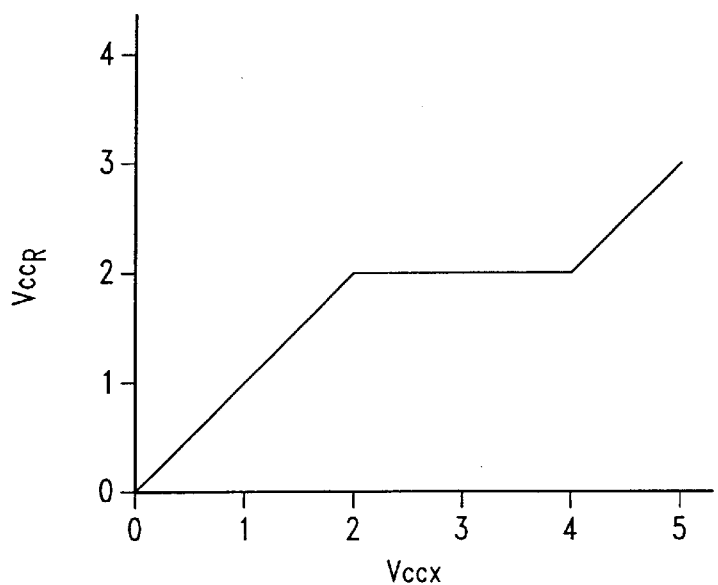
FIG. 3 is a graph showing the voltage generated by the system of FIG. 2 as a function of reference voltage or input power voltage.
Figure 5B:
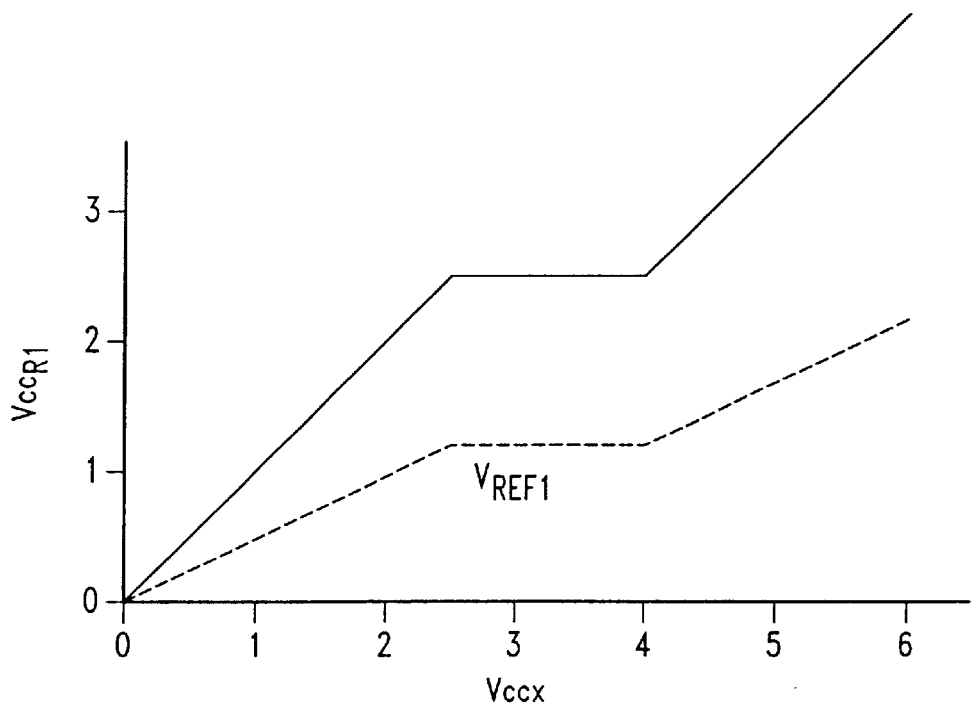

In contrast, as shown in FIG. 5B, the regulator circuit 100 applies a regulated output voltage $V_{CCR1}$ to than the arrays 20, 22 that increases from 2.5 volts to 3.5 volts as the external supply voltage $V_{CCX}$ increases from its normal operating range to 5 volts. As a result, the internal voltage regulator 80' is able to stress the arrays 20, 22 at a higher voltage than normally used without applying excessive voltages to the charge pumps 98. The regulator 80' thus avoids the problems described above with reference to FIGS. 2 and 3 when stress testing the SDRAM 10 with a voltage above the normal range of the external supply voltage $V_{CCX}$.

Although the internal voltage regulator 80' of FIG. 4 uses three separate regulator circuits 100, 102, 104, it will be understood that a fewer or greater number of regulator circuits may be used as long as a separate regulator circuit is provided to power the charge pumps 98 generating the pumped voltage $V_{PP}$. Thus, for example, the regulator circuit 104 may supply power to the charge pumps 98, and the regulator circuit 100 may supply power to the arrays 20, 22 and all of the other circuitry in the SDRAM 10. Using this embodiment, the regulator circuit 102 would be unnecessary. Also, although specific performance characteristics of the regulator circuits 100, 102, 104 have been described with reference to FIGS. 4 and 5, it will be understood that regulator circuits having other performance characteristics may be used.

Figure 6:
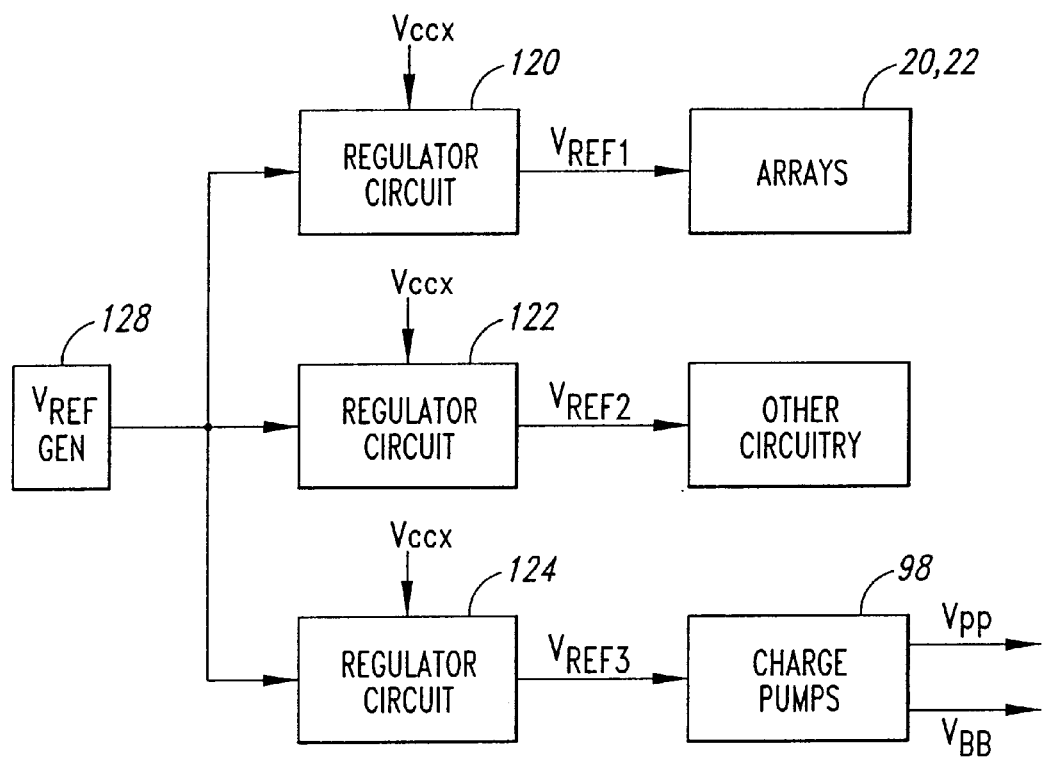
FIG. 6 is a block diagram of another embodiment of the invention for supplying regulated power to various components in the memory device of FIG. 1.

Another embodiment of a internal voltage regulator in accordance with the invention is illustrated in FIG. 6. The internal voltage regulator 80" has the same topography at conventional voltage regulator 80 of FIG. 2. However, the voltage regulator 80" uses regulator circuits 120, 122, 124, that, unlike the regulator circuits 90, 92, 94 used in the regulator 80 of FIG. 2, are not identical to each other and thus do not have the same performance characteristics. Instead, the regulator circuit 124 supplying power to charge pumps 98 differs from the regulator circuit 120 supplying power to the arrays 20, 22 and preferably also to the regulator circuit 122 supplying power to the other circuitry in the SDRAM 10. Thus, although the regulator circuits 120, 122, 124 all receive the same reference voltage $V_{REF}$ from a common reference voltage generator 128, the performance characteristics of the regulator circuit 124 cause it to generate a regulated output voltage $V_{CCR3}$ that differs from the regulated output voltage $V_{CCR1}$ generated by the regulator circuit 120 as the external supply voltage $V_{CCX}$ is increased about its normal operating range. For example, the regulator circuit 124 may be designed so that it has the performance characteristics shown in FIG. 5A. Similarly, the regulator circuit 120 may be designed so that it has the performance characteristics shown in FIG. 5B. The design of the regulator circuits 120, 122, 124 having these characteristics is well within the ability of those skilled in the art. Therefore, in the interest of brevity, an explanation of specific regulator designs will be omitted.

As with the internal voltage regulator 80' of FIG. 4, the voltage regulator 80" of FIG. 6 may be altered somewhat without departing from the spirit of the invention. For example, the regulator circuit 120 may be used to supply power to the arrays 20, 22 and the other circuitry in the SDRAM 10, thus making the regulator circuit 122 unnecessary. Also, one or more of the regulator circuits 120, 122, 124 may include an internal voltage regulating component, such as a zener diode (not shown), thus making the external reference voltage $V_{REF}$ unnecessary.

Figure 1:
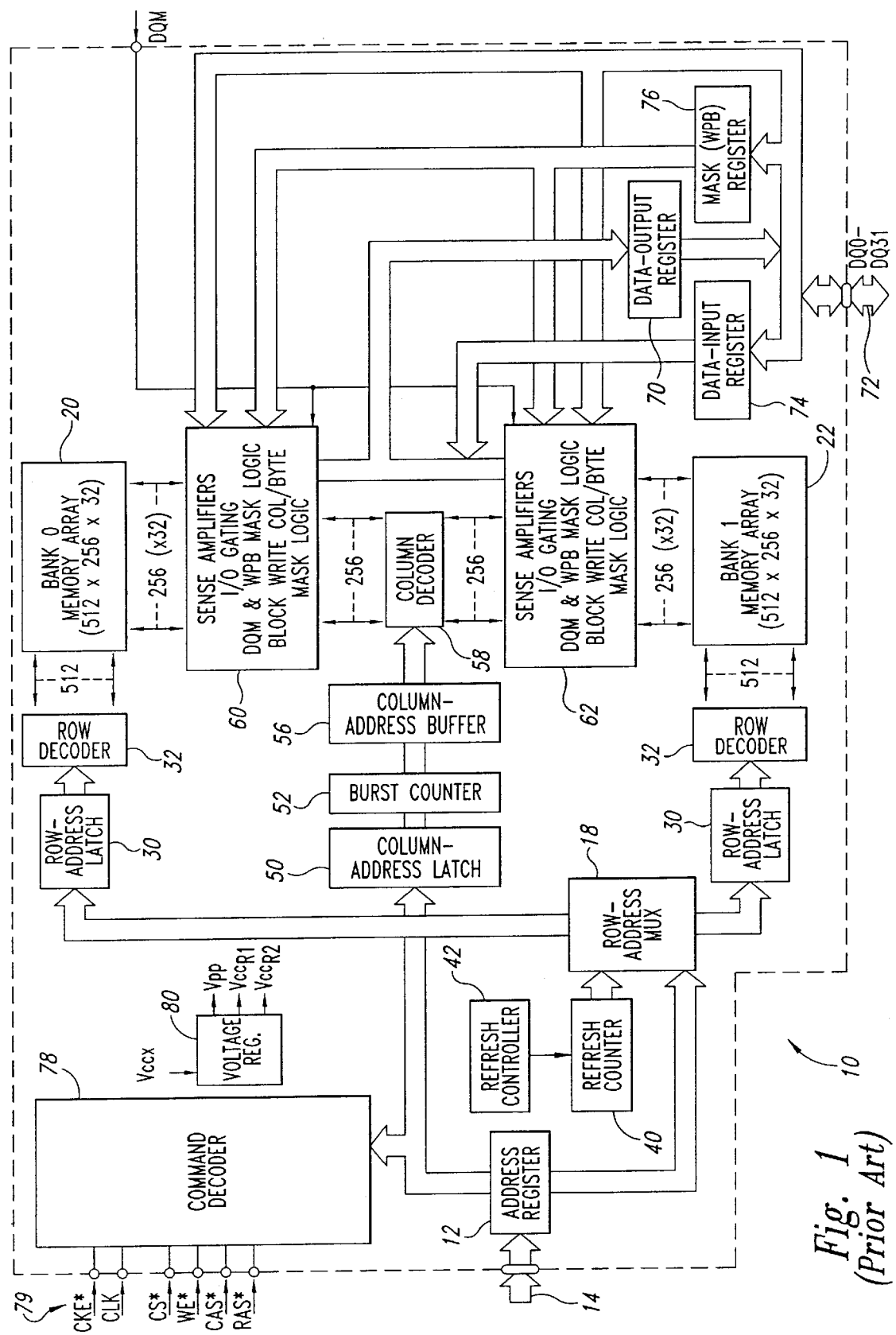
FIG. 1 is a block diagram of a conventional memory device.
Figure 7:
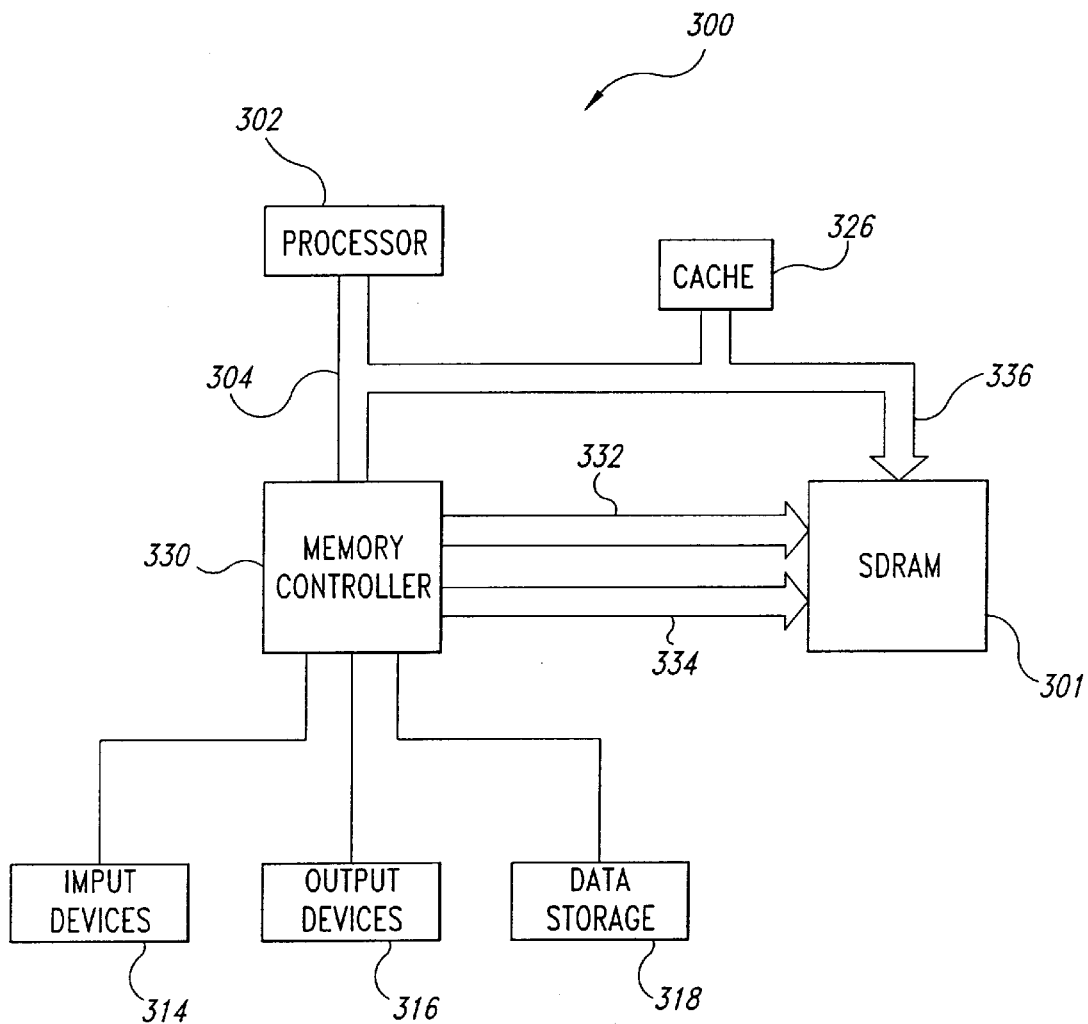
FIG. 7 is a block diagram of a computer system that includes the memory device of FIG. 1 containing an embodiment of the inventive system for supplying regulated power to components in the memory device.

FIG. 7 is a block diagram of a computer system 200 that includes the SDRAM 10 of FIG. 1 containing the voltage regulator 80' of FIG. 4 or the voltage regulator 80" of FIG. 6. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to store data or retrieve data from external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 10 through a memory controller 230. The memory controller 230 normally includes the control bus 79 and the address bus 14 that are coupled to the SDRAM 10. The data bus 72 of the SDRAM 10 may be coupled to the processor bus 204 either directly (as shown), through the memory controller 230, or by some other means.

It is thus seen that voltage regulators in accordance with the invention are capable of supplying regulated power to the internal components of the SDRAM 10 while allowing the arrays to be stress tested with a relatively high voltage without damaging the charge pumps in the SDRAM 10. As mentioned above, although the inventive voltage regulators have been described in the context of an SDRAM 10, it will be understood that it may be used in other types of memory devices, including DRAMs other than SDRAMs.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An internal voltage regulator for a memory device having an array of memory cells and a charge pump, the internal voltage regulator comprising a plurality of regulator circuits adapted to receive an external supply voltage and being operable to generate respective regulated output voltages, a first of the regulator circuits being coupled to the array of memory cells to supply a first regulated output voltage thereto, and a second of the regulator circuits being coupled to the charge pump to supply a second regulated output voltage thereto, the first regulator circuit being structured to generate the first regulated output voltage as a first function of the external supply voltage and the second regulator circuit being structured to generate the second regulated output voltage as a second function of the external supply voltage, the first function being differing from the second function.

2. The internal voltage regulator of claim 1 wherein the regulator circuits each include a reference input adapted to receive a reference voltage, and wherein the regulator circuits are constructed to regulate the magnitude of their respective regulated output voltages at a value corresponding the magnitude of a reference voltage applied to their respective reference inputs.

3. The internal voltage regulator of claim 1 wherein each of the regulator circuits includes reference voltage circuit components that control the magnitude of the respective regulated output voltages as a function of the magnitude of the external supply voltage.

4. The internal voltage regulator of claim 1 further comprising a third regulator circuit coupled to internal components of the memory device other than the memory array and the charge pump to supply a third regulated output voltage to the other components.

5. The internal voltage regulator of claim 1 wherein the memory device comprises a dynamic random access memory.

6. The internal voltage regulator of claim 5 wherein the dynamic random access memory comprises a synchronous dynamic random access memory.

7. An internal voltage regulator for a memory device having an array of memory cells and a charge pump, the internal voltage regulator comprising:

first regulator means receiving an external supply voltage and generating a first regulated output voltage as a first function of the external supply voltage, the first regulator means applying the first regulated output voltage to the array of memory cells; and second regulator means receiving the external supply voltage and generating a second regulated output voltage as a second function of the external supply voltage, the second function being different from the first function, the second regulator means applying the second regulated output voltage to the charge pump.

8. The internal voltage regulator of claim 7 wherein:

the first voltage regulator means comprise:

means for maintaining the magnitude of the first regulated output voltage substantially constant responsive to the magnitude of the external supply voltage being in a normal operating range; and means for increasing the magnitude of the first regulated output voltage responsive to the magnitude of the external supply voltage increasing above the normal operating range; and the second voltage regulator means comprise:

means for maintaining the magnitude of the second regulated output voltage substantially constant responsive to the magnitude of the external supply voltage being in the normal operating range; and means for maintaining the magnitude of the second regulated output voltage substantially constant responsive to the magnitude of the external supply voltage increasing by at least some magnitude above the normal operating range.

9. The internal voltage regulator of claim 7 wherein the first and second regulator means each include a reference input adapted to receive a reference voltage, and wherein the regulator means each comprise means for regulating the magnitude of their respective regulated output voltages at a value corresponding the magnitude of a reference voltage applied to their respective reference inputs.

10. The internal voltage regulator of claim 7 wherein each of the first and second regulator means reference voltage means that control the magnitude of the respective regulated output voltages as a function of the magnitude of the external supply voltage.

11. The internal voltage regulator of claim 7 further comprising third regulator means for supplying a third regulated output voltage to internal components of the memory device other than the memory array and the charge pump.

12. The internal voltage regulator of claim 7 wherein the memory device comprises a dynamic random access memory.

13. The internal voltage regulator of claim 12 wherein the dynamic random access memory comprises a synchronous dynamic random access memory.

14. A memory device, comprising:
at least one array of memory cells adapted to store data at a location determined by a row address and a column address;
a row address circuit adapted to receive and decode the row address, and to select a row of memory cells corresponding to the row address responsive to a first command signal;
a column address circuit adapted to receive data from or apply data to one of the memory cells in the selected row corresponding to the column address responsive to a second command signal;
a data path circuit adapted to couple data between an external terminal and the column address circuit responsive to a third command signal;
a charge pump constructed to generate a pumped voltage to supply power to at least part of either the at least one array of memory cells or the data path;
a first regulator circuit adapted to receive an external supply voltage and to generate a first regulated output voltage as a first function of the external supply voltage, the first regulated output voltage being used to supply power to the at least one array of memory cells; and
a second regulator circuit adapted to receive the external supply voltage and to generate a second regulated output voltage as a second function of the external supply voltage that is different from the first function, the second regulated output voltage being used to supply power to the charge pump.

15. The memory device of claim 14 wherein the regulator circuits each include a reference input adapted to receive a reference voltage, and wherein the regulator circuits are constructed to regulate the magnitude of their respective regulated output voltages at a value corresponding the magnitude of a reference voltage applied to their respective reference inputs.

16. The memory device of claim 14 wherein each of the regulator circuits includes reference voltage circuit components that control the magnitude of the respective regulated output voltages as a function of the magnitude of the external supply voltage.

17. The memory device of claim 14 further comprising a third regulator circuit coupled to internal components of the memory device other than the memory array and the charge pump to supply a third regulated output voltage to the other components.

18. The memory device of claim 14 wherein the memory device comprises a dynamic random access memory.

19. The memory device of claim 18 wherein the dynamic random access memory comprises a synchronous dynamic random access memory.

20. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus, the memory device comprising:
at least one array of memory cells adapted to store data at a location determined by a row address and a column address;
a row address circuit adapted to receive and decode the row address, and to select a row of memory cells corresponding to the row address responsive to a first command signal;
a column address circuit adapted to receive data from or apply data to one of the memory cells in the selected row corresponding to the column address responsive to a second command signal;
a data path circuit adapted to couple data between an external terminal and the column address circuit responsive to a third command signal;
a charge pump constructed to generate a pumped voltage to supply power to at least part of either the at least one array of memory cells or the data path;
a first regulator circuit adapted to receive an external supply voltage and to generate a first regulated output voltage as a first function of the external supply voltage, the first regulated output voltage being used to supply power to the at least one array of memory cells; and
a second regulator circuit adapted to receive the external supply voltage and to generate a second regulated output voltage as a second function of the external supply voltage that is different from the first function, the second regulated output voltage being used to supply power to the charge pump.

21. The computer system of claim 20 wherein the first voltage regulator is constructed to maintain the magnitude of the first regulated output voltage substantially constant responsive to the magnitude of the external supply voltage being in a normal operating range, and to increase the magnitude of the first regulated output voltage responsive to the magnitude of the external supply voltage increasing above the normal operating range, and the second voltage regulator is constructed to maintain the magnitude of the second regulated output voltage substantially constant responsive to the magnitude of the external supply voltage being in the normal operating range and responsive to the magnitude of the external supply voltage increasing by at least some magnitude above the normal operating range.

22. The computer system of claim 20 wherein the regulator circuits each include a reference input adapted to receive a reference voltage, and wherein the regulator circuits are constructed to regulate the magnitude of their respective regulated output voltages at a value corresponding the magnitude of a reference voltage applied to their respective reference inputs.

23. The computer system of claim 20 wherein each of the regulator circuits includes reference voltage circuit components that control the magnitude of the respective regulated output voltages as a function of the magnitude of the external supply voltage.

24. The computer system of claim 20 further comprising a third regulator circuit coupled to internal components of the memory device other than the memory array and the charge pump to supply a third regulated output voltage to the other components.

25. The computer system of claim 20 wherein the memory device comprises a dynamic random access memory.

26. The computer system of claim 25 wherein the dynamic random access memory comprises a synchronous dynamic random access memory.

27. A method of powering an array of memory cells and a charge pump fabricated in a common integrated circuit that is powered by an external supply voltage, the method comprising:

supplying power to at least a portion of the array at a first voltage that is a first function of the external supply voltage; and supplying power to the charge pump at a second voltage that is a second function of the external supply voltage, the second function being different from the first function.

28. The method of claim 27 wherein the first function comprises maintaining the first voltage substantially constant as the external supply voltage is increased to a predetermined voltage and then increasing the first voltage as the external supply voltage is increased beyond the predetermined voltage.

29. The method of claim 28 wherein the second function comprises maintaining the second voltage substantially constant as the external supply voltage is increased to the predetermined voltage and maintaining the second voltage substantially constant as the external supply voltage is increased beyond the predetermined voltage.

30. The method of claim 27 wherein the integrated circuit comprises a memory device.

31. The method of claim 30 wherein the memory device comprises a dynamic random access memory.

* * * * *

UNITED STATES PATENT AND TRADEMARK OFFICE
CERTIFICATE OF CORRECTION

PATENT NO. : 6,385,098 B2
DATED : May 7, 2002
INVENTOR(S) : Hal W. Butler, Stephen L. Casper and Stephen R. Porter It is certified that error appears in the above-identified patent and that said Letters Patent is hereby corrected as shown below:

Column 9,
Line 12, reads "means" should read -- means includes --

Signed and Sealed this

Fifteenth Day of October, 2002

Attest:

JAMES E. ROGAN
Attesting Officer
Director of the United States Patent and Trademark Office